(12) United States Patent
Wada

(10) Patent No.: US 8,891,272 B2
(45) Date of Patent: Nov. 18, 2014

(54) CONTENT ADDRESSABLE MEMORY SYSTEM

(71) Applicant: Renesas Electronics Corporation, Kawasaki-shi, Kanagawa (JP)

(72) Inventor: Mihoko Wada, Itami (JP)

(73) Assignee: Renesas Electronics Corporation, Kanagawa (JP)

( * ) Notice: Subject to any disclaimer, the term of this patent is extended or adjusted under 35 U.S.C. 154(b) by 3 days.

(21) Appl. No.: 13/711,061

(22) Filed: Dec. 11, 2012

(65) Prior Publication Data

US 2013/0242632 A1  Sep. 19, 2013

(30) Foreign Application Priority Data

Mar. 14, 2012 (JP) ................................. 2012-057060

(51) Int. Cl.
*G11C 15/04* (2006.01)
*G11C 15/00* (2006.01)
*G11C 15/02* (2006.01)

(52) U.S. Cl.
CPC ............... *G11C 15/00* (2013.01); *G11C 15/02* (2013.01); *G11C 15/04* (2013.01); *G11C 15/043* (2013.01); *G11C 15/046* (2013.01)
USPC ................. 365/49.17; 365/49.11; 365/49.12; 365/49.13; 365/49.15; 365/49.16

(58) Field of Classification Search
USPC .......... 365/49.11, 49.12, 49.13, 49.14, 49.15, 365/49.16, 49.17, 49.18, 189.07, 203, 49.1, 365/230.06, 201

See application file for complete search history.

(56) References Cited

U.S. PATENT DOCUMENTS

| 6,728,124 | B1 * | 4/2004 | Ichiriu et al. ............... 365/49.15 |
| 6,967,856 | B1 | 11/2005 | Park et al. |
| 7,436,688 | B1 | 10/2008 | Maheshwari |
| 7,505,295 | B1 * | 3/2009 | Nataraj et al. ............... 365/49.1 |
| 8,630,141 | B2 * | 1/2014 | Tamlyn ......................... 365/222 |
| 2003/0058672 | A1 | 3/2003 | Aikawa |
| 2006/0198210 | A1 * | 9/2006 | Hanzawa et al. ........ 365/189.07 |
| 2007/0247885 | A1 | 10/2007 | Watanabe et al. |

FOREIGN PATENT DOCUMENTS

| JP | 2003-100086 A | 4/2003 |
| JP | 2007-317342 A | 12/2007 |

* cited by examiner

*Primary Examiner* — Richard Elms
*Assistant Examiner* — Mohammed A Bashar
(74) *Attorney, Agent, or Firm* — Sughrue Mion, PLLC

(57) ABSTRACT

There is a need to highly integrate a circuit area of content addressable memory (CAM) and ensure faster operation thereof.
A priority encoder and row decoder portion shares a row address register including more than one row. Each row of the row address register corresponds to each entry of a TCAM array mat and retains each address. Each row of the row address register corresponds to each word line and match line of the TCAM array mat. Writing data to the TCAM array mat activates word line for a row retained in the row address register corresponding to a specified address. Searching for the TCAM array mat activates a match line for the TCAM array mat. The row address register for the corresponding row stores the address of an entry for the TCAM array mat matching search data.

3 Claims, 19 Drawing Sheets

FIG. 16

SEARCH LOGICAL EXPRESSIONS
(1) DETERMINE WHETHER SEARCH DATA (SL) MATCHES STORAGE DATA Y.
(2) ASSUME always miss IF STORAGE DATA X AND Y ARE BOTH 1S.
(3) ASSUME always hit IF STORAGE DATA X AND Y ARE BOTH 0S.

| SL (SEARCH DATA) | SNX (STORAGE DATA X) | SNY (STORAGE DATA Y) | ML (MATCH_LINE) |
|---|---|---|---|
| 0 | 1 | 0 | 1 (MATCH) |
| 0 | 0 | 1 | 0 (MISMATCH) |
| 0 | 0 | 0 | 1 (MATCH) Always Hit |
| 0 | 1 | 1 | 0 (MISMATCH) Always Miss |
| 1 | 0 | 1 | 1 (MATCH) |
| 1 | 1 | 0 | 0 (MISMATCH) |
| 1 | 0 | 0 | 1 (MATCH) Always Hit |
| 1 | 1 | 1 | 0 (MISMATCH) Always Miss |

CONTENT ADDRESSABLE MEMORY SYSTEM

CROSS-REFERENCE TO RELATED APPLICATIONS

The disclosure of Japanese Patent Application No. 2012-057060 filed on Mar. 14, 2012 including the specification, drawings and abstract is incorporated herein by reference in its entirety.

The present invention relates to a content addressable memory system. More particularly, the invention relates to a technology for high integration and acceleration of a circuit.

BACKGROUND

The content addressable memory (CAM) reads and writes data, and searches for storage data.

To write data, the CAM transfers write data to a bit line (BL) and allows a row decoder to activate a word line (WL) corresponding to the write address.

To search for data, the CAM activates a search line (SL) based on a data string to be searched for and determines whether data matches each entry in a CAM array. The CAM outputs an address of the matching entry as a search result. One entry stores a data word to be searched for and includes more than one CAM cell. Each entry is provided with a match line (ML). The match line parallel links with the CAM cell corresponding to each entry. The CAM compares the data string to be searched for with a data word stored in each entry. If a match is found as a result of the comparison, the match line corresponding to the entry remains the high level (1). If no match is found as a result of the comparison, electric discharge changes the match line for that entry to the low level (0).

Identifying a voltage level for the match line enables to determine whether the CAM stores data corresponding to the search data.

As a result of the search, the CAM may yield more than one matching entry. In such a case, a priority encoder prioritizes a given entry and outputs the corresponding address.

The CAM is used for a path search in network devices such as a router and a switch or determination of a cache miss or hit in the cache memory. For example, a network router performs IP packet routing. The router stores the CAM that stores IP addresses. The routing collates the IP addresses stored in the CAM with an IP address input from the outside. For example, the CAM in the router writes a value indicating the next destination to an IP packet based on match line information representing the match state and transmits the IP packet from a corresponding port.

Patent Document 1: U.S. Pat. No. 6,967,856
Patent Document 2: Japanese patent laid-open No. 2007-317342
Patent Document 3: Japanese patent laid-open No. 2003-100086
Patent Document 4: U.S. Pat. No. 7,436,688

SUMMARY

Recently, the tendency has been to further accelerate search operation of the large-scale high-speed CAM used for network memory, for example. The search operation acceleration requires: (1) determining whether search data matches data stored in the CAM; and (2) accelerating operation of the priority encoder that outputs the address of a highly prioritized one of matching entries.

Concerning requirement (1), U.S. Pat. No. 6,967,856 (patent document 1) describes the technology of dividing the match line. Japanese patent laid-open No. 2007-317342 (patent document 2) and Japanese patent laid-open No. 2003-100086 (patent document 3) describe the technologies of accelerating search operation using a match amplifier that can detect a fine potential difference on the match line.

Requirement (2) necessitates accelerating operation of the priority encoder and operation of writing to the CAM. For example, the CAM used for network memory needs to perform write operation at a specified time interval because the routing table needs to be updated at a specified time interval.

The CAM needs to be more highly integrated. A peripheral circuit for the CAM is accelerated and increases its area accordingly. There is a problem of degrading the integration of the peripheral circuit layout. U.S. Pat. No. 7,436,688 (patent document 4) uses ROM for the priority encoder to accelerate the peripheral circuit but cannot highly integrate the peripheral circuit.

These and other objects and novel features of the invention may be readily ascertained by referring to the following description and appended drawings.

According to an embodiment of the invention, a row decoder and a priority encoder share an address register including more than one row. Each row in the address register corresponds to each row in a CAM array and stores an address of each row in the CAM array. Each row of the address register corresponds to a word line and a match line for each row of the CAM array. When writing data to the CAM array, the row decoder accepts address specification and activates the word line for a row retained in the address register. On the other hand, searching for the CAM array activates the match line for the CAM array. The address register for the row corresponding to the match line stores the address of a row for the CAM array matching search data.

The embodiment can highly integrate a circuit area for the CAM and accelerate the CAM.

BRIEF DESCRIPTION OF THE DRAWINGS

FIG. 16 illustrates a TCAM basic cell to configure TCAM using SRAM;

DETAILED DESCRIPTION

Embodiments of the present invention will be described with reference to the accompanying drawings.

First Embodiment

Figure 1:
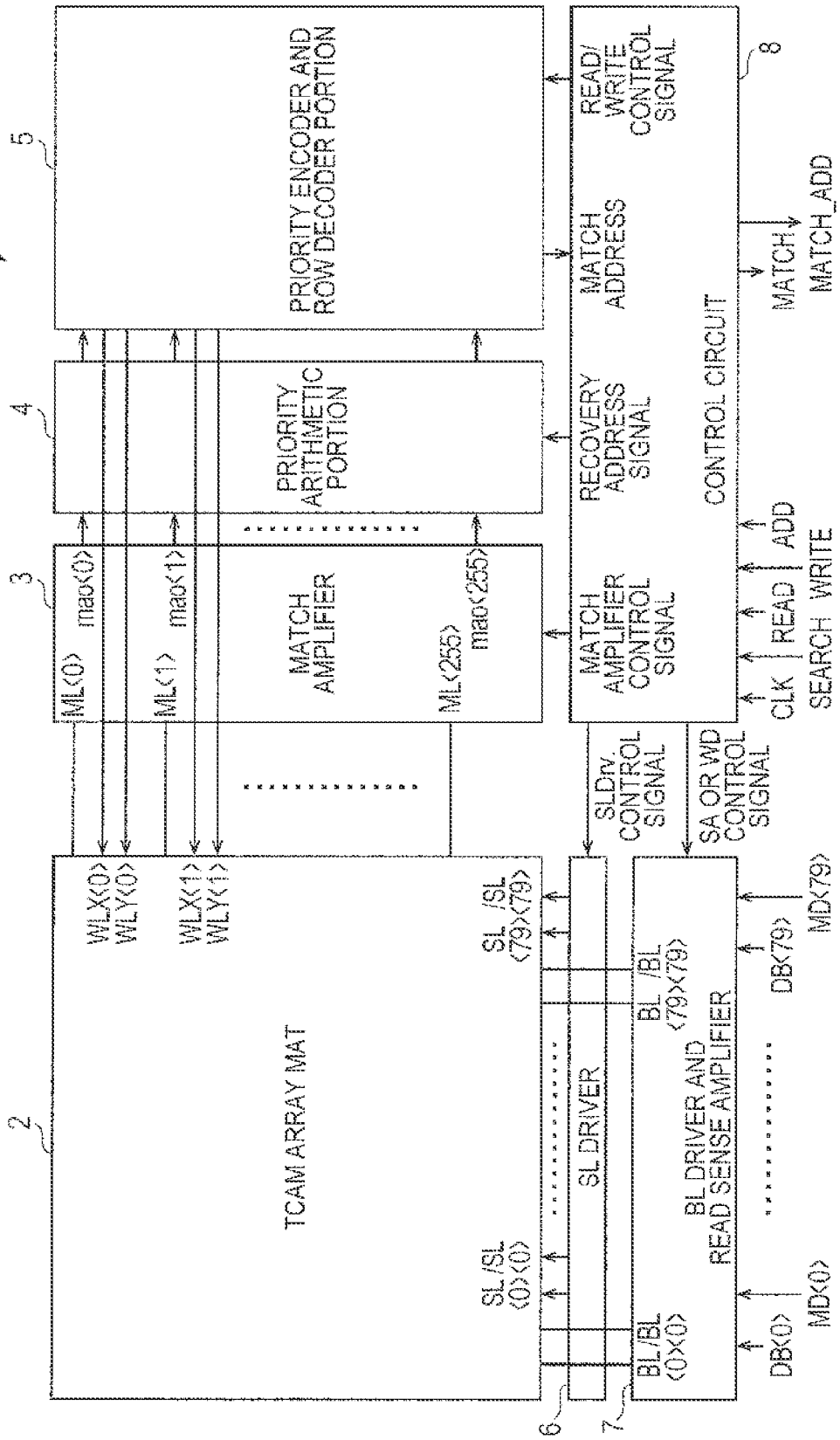
FIG. 1 is a block diagram illustrating a configuration of a content addressable memory system 1 according to an embodiment.

FIG. 1 is a block diagram illustrating a configuration of a content addressable memory system 1 according to the embodiment.

As illustrated in FIG. 1, the content addressable memory system 1 includes a TCAM array mat 2, a match amplifier 3, a priority arithmetic portion 4, a priority encoder and row decoder portion 5, an SL driver 6, a BL driver and read sense amplifier 7, and a control circuit 8.

The TCAM array mat 2 maintains storage data using more than one entry. Each entry includes more than one CAM cell though each CAM cell is not illustrated. Each entry is provided with an address. The TCAM array mat 2 accepts input search data and determines in parallel whether each entry matches the storage data. The TCAM array mat 2 is configured as ternary content addressable memory (Ternary CAM). Each CAM cell can take one of three values high (1), low (0), and don't care (X).

Writing to the TCAM Array Mat 2

Specifically, the TCAM array mat 2 enables storage data writing in units of rows (entries). The BL driver and read sense amplifier 7 to be described activates a bit line (BL) based on data written to the TCAM array mat 2. The priority encoder and row decoder portion 5 to be described activates a word line (WL) corresponding to an address for the row where data is written in the TCAM array mat 2. The content addressable memory system 1 uses the bit line and the word line to write data to an address specified in the TCAM array mat 2.

Searching for the TCAM Array Mat 2

The TCAM array mat 2 searches for storage data corresponding to each entry in the TCAM array mat 2. For this purpose, the TCAM array mat 2 uses a search line (SL) to accept search data used for the search. A match line (ML) maintains high level for an entry that ensures a match between search data and storage data.

The match amplifier 3 operates under control of a match amplifier control signal from the control circuit 8. The match amplifier 3 amplifies an output from the match line during the search in the TCAM array mat 2.

More than one entry may enable a match between the search data and storage data. In such a case, the priority arithmetic portion 4 preferentially outputs any one of the entries in accordance with a specified operation. For example, more than one address may be hit if the search uses value X. In this case, the priority arithmetic portion 4 preferentially outputs an entry corresponding to the smallest address, for example, to preferentially output a search result for any one of the entries.

The priority encoder and row decoder portion 5 includes a row address register 12 to be described and functions as the priority encoder and the row decoder. That is, the priority encoder and the row decoder share the row address register 12. The detail will be described later. A summary follows. When functioning as the priority encoder, the priority encoder and row decoder portion 5 receives an output result from the priority arithmetic portion 4 and outputs an address (match address) to the control circuit 8. The match address corresponds to the match line that is hit during the search. When functioning as the row decoder, the priority encoder and row decoder portion 5 operates based on a READ/WRITE control signal from the control circuit 8. The priority encoder and row decoder portion 5 accepts the specification of an address of the TCAM array mat 2 for data reading or writing and activates a word line corresponding to the address.

The SL driver 6 drives a search line in accordance with a search line driver control signal (SLDrv. control signal) from the control circuit 8. The search line outputs search data to the TCAM array mat 2 during the search in the TCAM array mat 2.

The BL driver and read sense amplifier 7 drives a bit line to write data to the TCAM array mat 2 under control of the control circuit 8.

The control circuit 8 controls a control signal to overall control operations of the content addressable memory system 1. The control circuit 8 accepts various commands (e.g., SEARCH) from the outside, operates according to a specified clock (CLK), and outputs a search result (MATCH_ADD) from the TCAM array mat 2.

The following describes in detail the priority arithmetic portion 4 and the priority encoder and row decoder portion 5.

Figure 2:
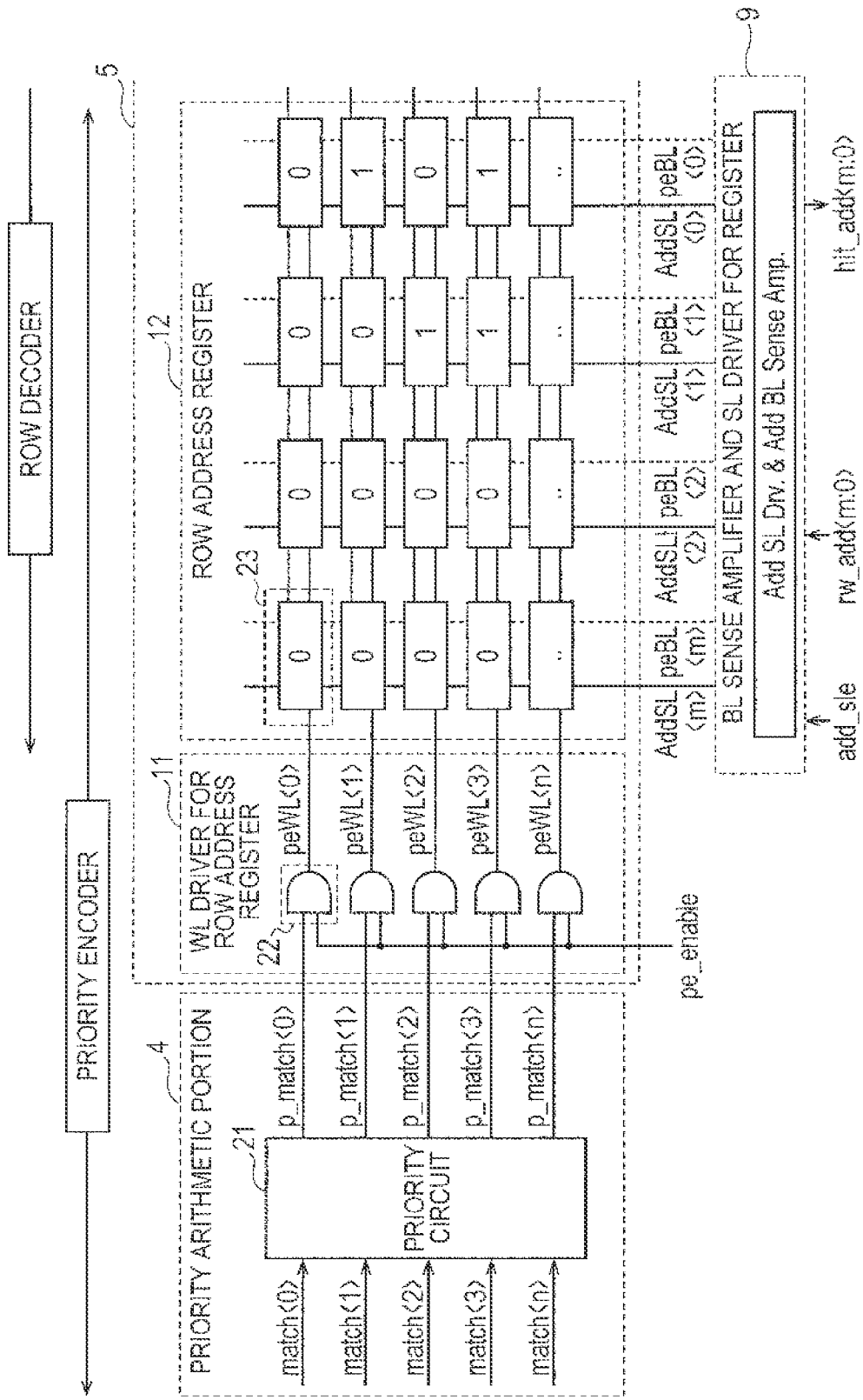
FIG. 2 illustrates the configuration of a priority arithmetic portion 4 and part of a priority encoder and row decoder portion 5 functioning as a priority encoder.

FIG. 2 illustrates the configuration of the priority arithmetic portion 4 and part of the priority encoder and row decoder portion 5 functioning as the priority encoder.

The priority arithmetic portion 4 includes an operation result output circuit 21 and accepts outputs from the match amplifier 3 through more than one match line (match <0> through match <n>). If more than one match line is hit, the operation result output circuit 21 prioritizes any one of the match lines and outputs it to the priority encoder and row decoder portion 5 (p_match).

The priority encoder and row decoder portion 5 includes a WL driver for row address register 11, the row address register 12, and a WL driver for CAM cell 13. FIG. 2 illustrates the WL driver for row address register 11 and the row address register 12.

According to the embodiment, the row address register 12 includes more than one CAM cell 23. The row address register 12 uses each row to maintain an address for any of the entries in the TCAM array mat 2. Each row of the row address register 12 accepts an output from the match line of the TCAM array mat 2 via the priority arithmetic portion 4 or the WL driver for CAM cell 13 to activate the word line. According to the example in FIG. 2, the row address register 12 stores addresses 0000, 0001, 0010, and so on in order from the top of FIG. 2 to indicate the entries of the TCAM array mat 2. Each address is coupled to the corresponding entry in the TCAM array mat 2 via the word line and the match line.

The WL driver for row address register 11 activates the word line for the row address register 12 according to an enable signal pe_enable in order to allow the priority encoder and row decoder portion 5 to function as the priority encoder. The WL driver for row address register 11 includes a drive circuit 22 and accepts an output result from the priority arithmetic portion 4 via the match line. The WL driver for row address register 11 accepts the enable signal pe_enable and an output result from the priority arithmetic portion 4 to control an operation that allows the row address register 12 to output a search result.

The WL driver for row address register 11 and the row address register 12 mainly allow the priority encoder and row decoder portion 5 to function as the priority encoder. A result of searching for the TCAM array mat 2 is provided as output (peBL) through the bit line of the row address register 12 and is output to the BL sense amplifier and SL driver for register 9 (peBL).

Figure 3:
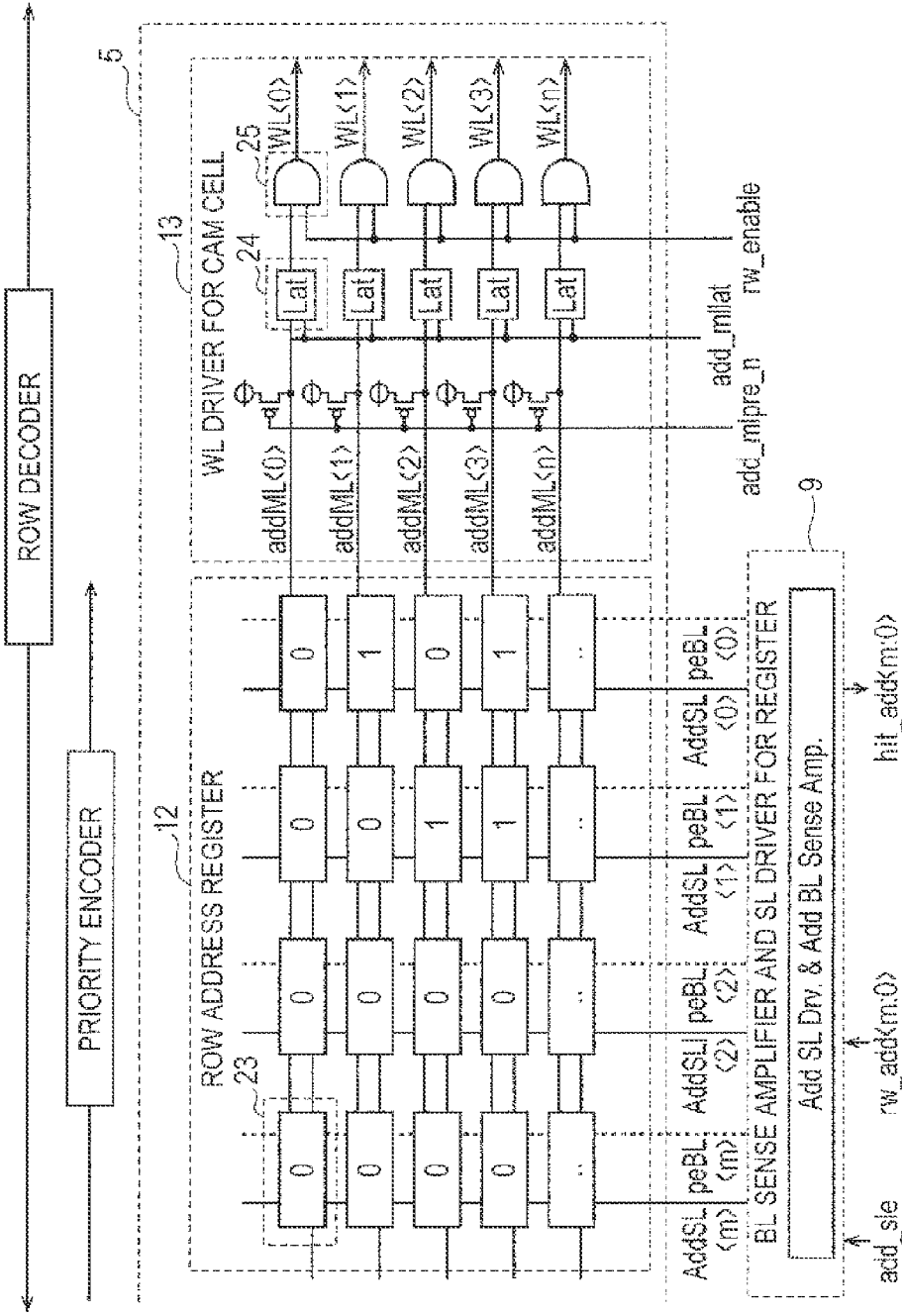
FIG. 3 illustrates the configuration of part of the priority encoder and row decoder portion 5 functioning as a row decoder.

FIG. 3 illustrates the configuration of part of the priority encoder and row decoder portion 5 functioning as the row decoder.

The row address register 12 and the WL driver for CAM cell 13 mainly allow the priority encoder and row decoder portion 5 to function as the row decoder. The BL sense amplifier and SL driver for register 9 (to be described) accepts specification (rw_add) of an address where data is to be written to the TCAM array mat 2. The BL sense amplifier and SL driver for register 9 outputs the address specification to the search line of the row address register 12 (AddSL). The row address register 12 activates the match line for the row corresponding to the specified address and outputs the address specification to the WL driver for CAM cell 13 (addML).

The WL driver for CAM cell 13 as well as the row address register 12 functions as the row decoder. The WL driver for CAM cell 13 accepts the output result from the match line of the row address register 12 and outputs the result according to control signal add_mlpre_n. The WL driver for CAM cell 13 allows a latch circuit 24 to maintain the output result from the match line of the row address register 12 according to the timing indicated in control signal add_mllat. A drive circuit 25 outputs the content maintained in the latch circuit 24 to the word line of the TCAM array mat 2 according to control signal rw_enable.

The BL sense amplifier and SL driver for register 9 configures part of the control circuit 8. The BL sense amplifier and SL driver for register 9 provides a sense amplifier function (BL Sense Amp) that amplifies a signal from the bit line of the row address register 12 in order to allow the priority encoder and row decoder portion 5 to function as the priority encoder. The BL sense amplifier and SL driver for register 9 provides an SL driver (SL Drv.) that controls operation of the search line of the row address register 12 according to control signal add_sle in order to allow the priority encoder and row decoder portion 5 to function as the row decoder. The BL sense amplifier and SL driver for register 9 accepts specification of an address (rw_add) where data is to be written to the TCAM array mat 2. The BL sense amplifier and SL driver for register 9 accepts an output result of the priority encoder and row decoder portion 5 functioning as the priority encoder and outputs the result (hit_add) to the outside.

According to the above-mentioned configuration, the priority encoder and the row decoder share the addresses corresponding to the entries of the TCAM array mat 2. Therefore, this configuration can ensure higher integration than a configuration that uses a decode circuit for each of the priority encoder and the row decoder.

Comparison with a Related Art Technology

The following describes a related art technology in which the priority encoder and the row decoder do not share an address register.

Figure 4:
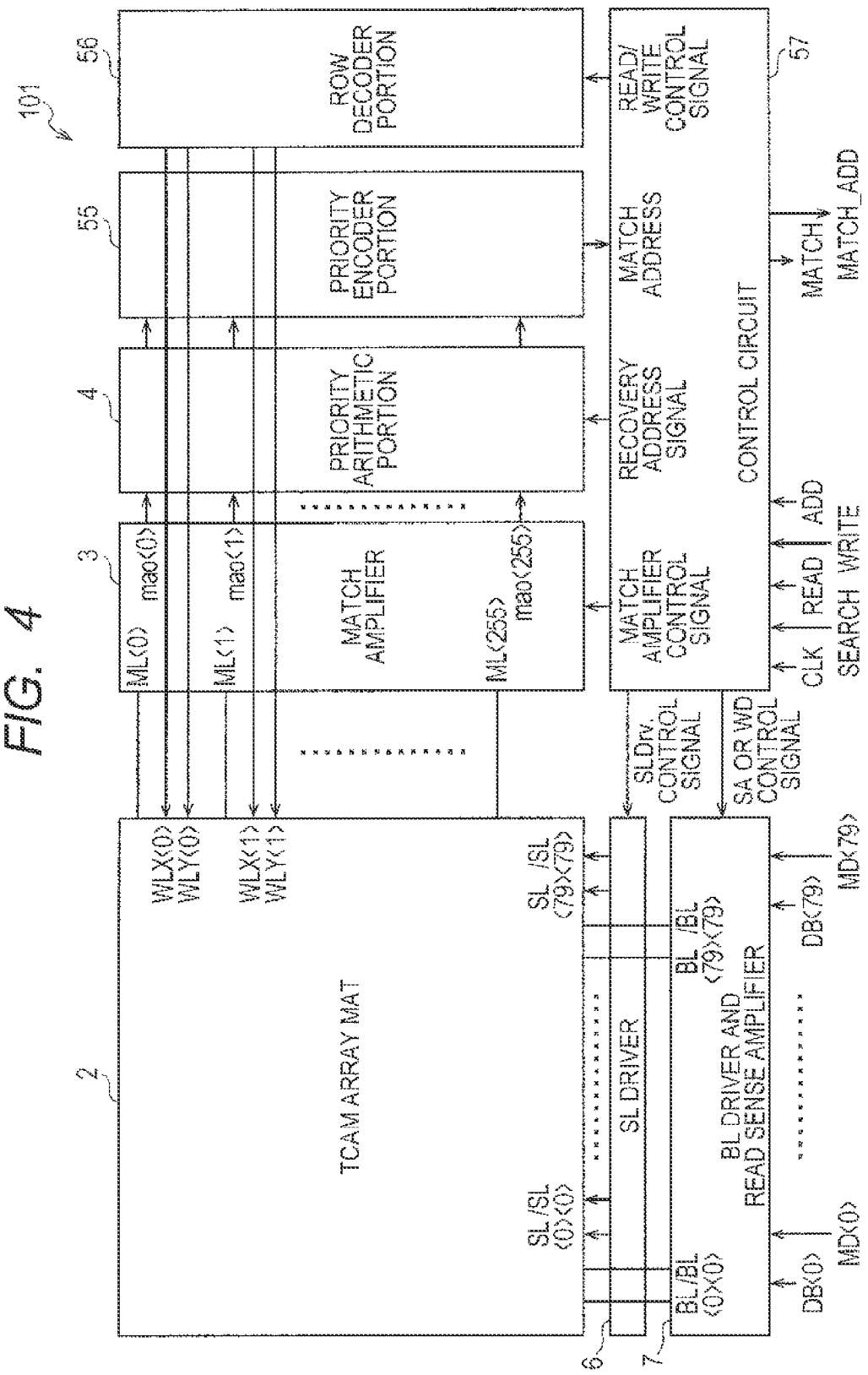
FIG. 4 illustrates a function block of the priority encoder and the row decoder that do not share an address register and are independent of each other.

FIG. 4 illustrates a function block of the priority encoder and the row decoder that do not share the address register and are independent of each other.

In a content addressable memory system 101, a priority encoder portion 55 and a row decoder portion 56 do not share an address register and are independent of each other. A control circuit 57 accepts a match address as a search result output to the TCAM array mat 2 from a priority encoder portion 55. The control circuit 57 outputs specification of an address to be written to the TCAM array mat 2 to a row decoder portion 56.

Figure 5:
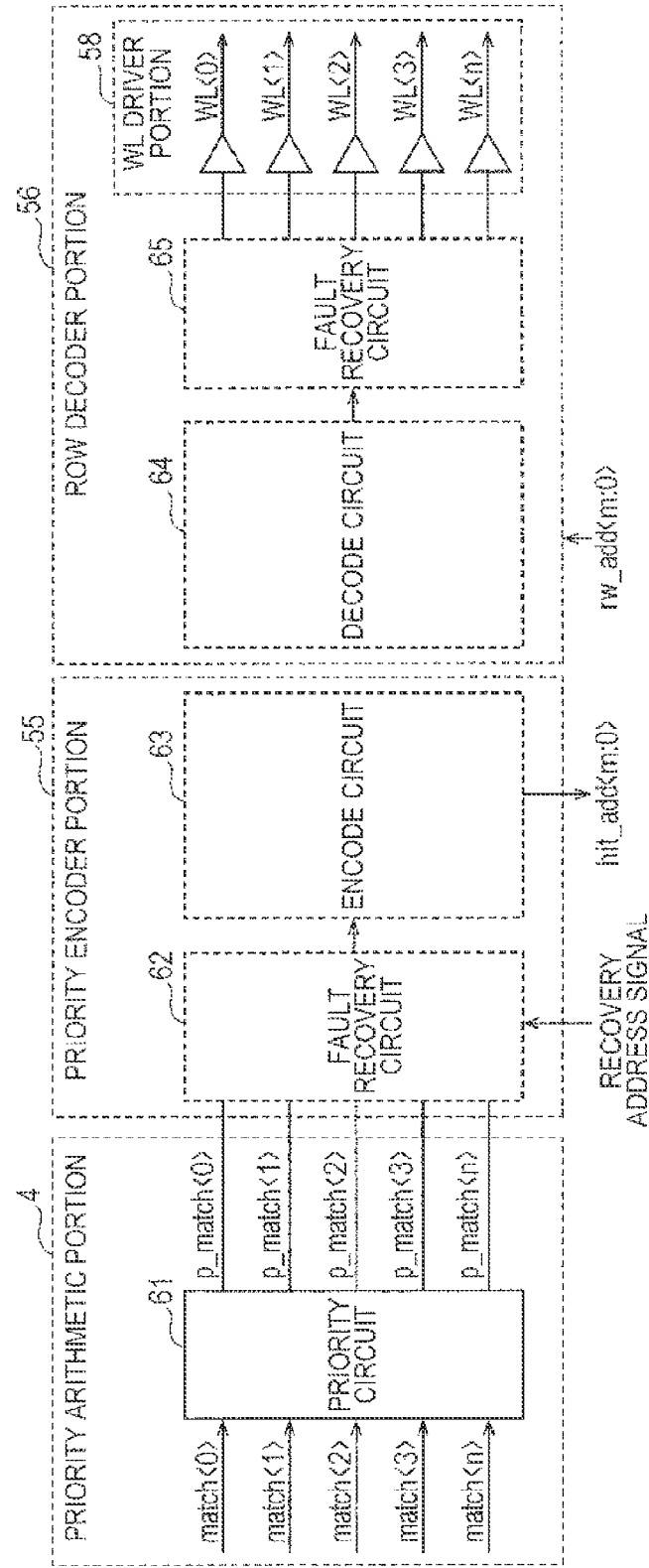
FIG. 5 illustrates in detail a configuration of the priority arithmetic portion 4, a priority encoder portion 55, and a row decoder portion 56 according to a related art technology.

FIG. 5 illustrates in detail a configuration of the priority arithmetic portion 4, the priority encoder portion 55, and the row decoder portion 56 according to the related art technology.

As illustrated in FIG. 5, the priority arithmetic portion 4 and the priority encoder portion 55 provide a function as the priority encoder.

The row decoder portion 56 provides a function as the row decoder.

The following describes the function as the priority encoder. The priority arithmetic portion 4 outputs an output from any match line to the priority encoder portion 55 based on operation of the operation result output circuit 21 in the priority arithmetic portion 4.

The priority encoder portion 55 includes a fault recovery circuit 62 and an encode circuit 63.

The fault recovery circuit 62 recovers a faulty entry in the TCAM array mat 2. To do this, for example, the fault recovery circuit 62 shifts an output result (p_match) in the operation result output circuit 21 according to a recovery address signal output from the control circuit 57.

The encode circuit 63 accepts an output result from the fault recovery circuit 62, encodes an address of the TCAM array mat 2 corresponding to the match line, and outputs the encoded address as a match address (hit_add) to the control circuit 57. The encode circuit 63 converts the match line into an address.

The following describes the function as the row decoder.

The row decoder portion 56 includes a decode circuit 64, a fault recovery circuit 65, and a WL driver portion 58.

The decode circuit 64 accepts specification (rw_add) of a write destination address for the TCAM array mat 2 from the control circuit 57 and activates the corresponding word line. The decode circuit 64 converts the word line into an address.

The fault recovery circuit 65 recovers a faulty entry in the TCAM array mat 2. To do this, for example, the fault recovery circuit 65 shifts an output from the decode circuit 64.

The WL driver portion 58 amplifies output results from the decode circuit 64 and the fault recovery circuit 65. The WL driver portion 58 thereby functions as a drive portion that activates the word line (WL).

Compared to the embodiment, the related art technology independently uses the encode circuit 63 and the decode circuit 64 to convert addresses in the TCAM array mat 2.

According to the embodiment, on the other hand, the priority encoder and the row decoder share the row address register 12. Compared to the related art technology, the embodiment can reduce the layout area and provide high integration. The embodiment can increase the processing speed by decreasing the number of logic stages.

Recovery Circuit in the First Embodiment

Now returning back to the description of the first embodiment, the following describes a faulty address recovery function according to the first embodiment.

The row address register 12 stores addresses after recovery from faults in order to recover a faulty entry in the TCAM array mat 2. For example, a chip test is conducted to identify a faulty entry. A fuse is used to settle a value (recovery code) to be stored in the row address register 12. When the power is turned on, the row address register 12 reads the recovery code.

Figure 6A:
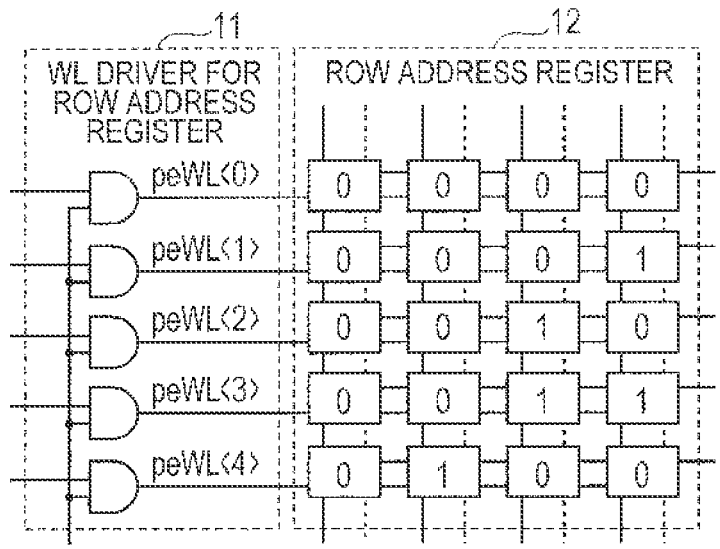
FIGS. 6A and 6B illustrate an address stored in a row address register 12 corresponding to a faulty entry.
Figure 6B:
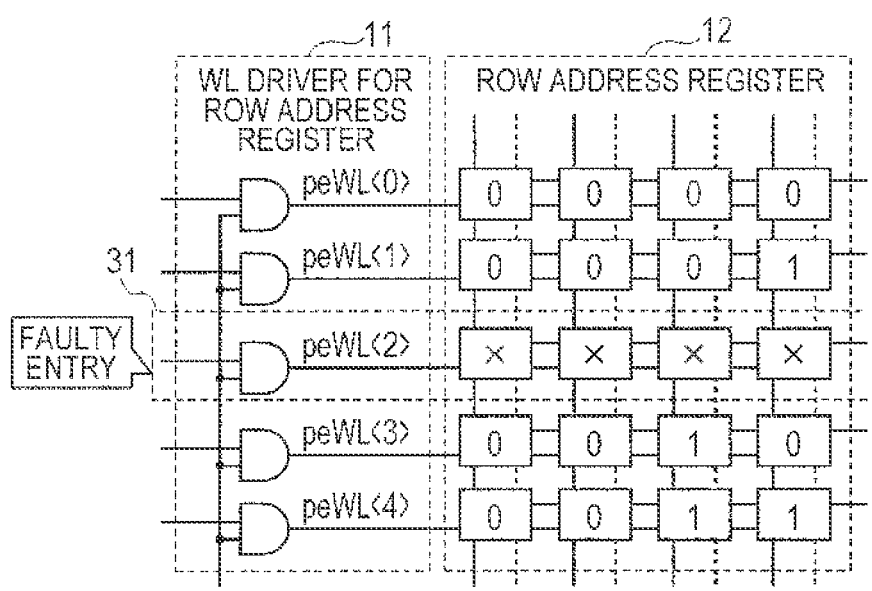
Figure 7A:
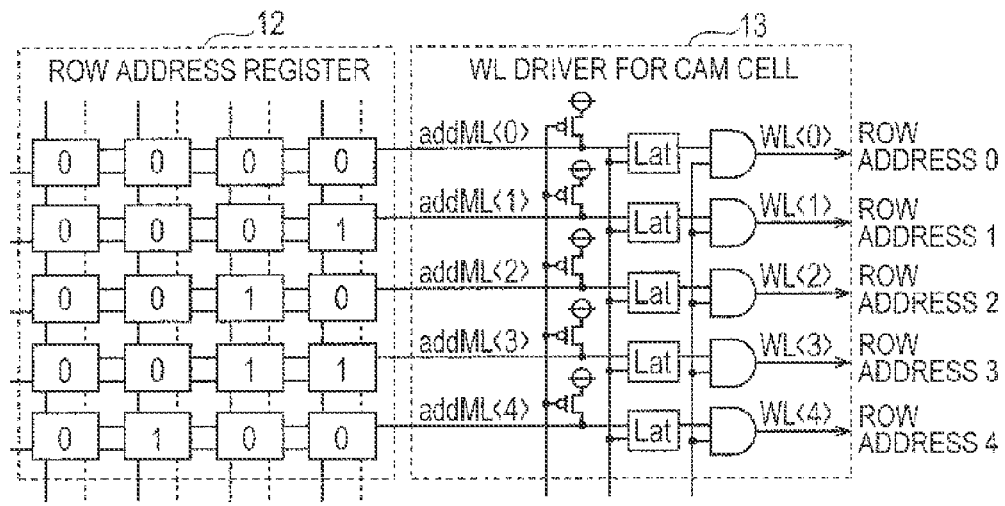
FIGS. 7A and 7B illustrate an address stored in the row address register 12 corresponding to a faulty entry.
Figure 7B:
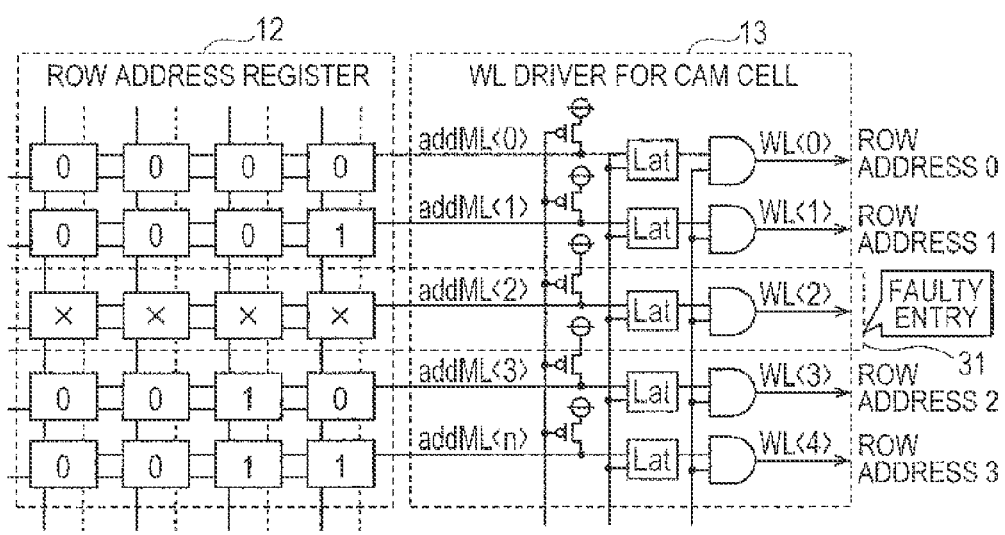

FIGS. 6A and 6B illustrate an address stored in the row address register 12 corresponding to a faulty entry. FIGS. 7A and 7B illustrate an address stored in the row address register 12 corresponding to a faulty entry. FIGS. 6A, 6B, 7A, and 7B mainly illustrate part of the row address register 12.

FIG. 6A shows addresses stored in the row address register 12 when no faulty entry is available. Since no recovery occurs, the row address register 12 stores 0000, 0001, 0010, 0011, and so on as address values at the corresponding rows in order from the top of FIG. 6A.

FIG. 6B shows addresses stored in the row address register 12 when a faulty entry occurs. A row 31 is assumed to correspond to the faulty entry (match <2> in FIG. 6B). In this case, for example, an entry immediately below the faulty entry is assumed to be an alternative entry. The subsequent address values are decremented by one and are written to the subsequent rows. The row address register 12 stores 0000, 0001, xxxx (corresponding to the faulty entry), 0010, 0011, and so on as address values at the corresponding rows in order from the top of FIG. 6B.

FIG. 7A shows address output values if no faulty entry occurs. FIG. 7B shows address output values if a faulty entry occurs.

As illustrated in FIG. 7B, the word line is not activated for the faulty entry row 31 corresponding to WL<2>. Address 0010 shifts to WL<3>.

Details of Operation According to the First Embodiment

The following describes operation of the content addressable memory system 1 according to the first embodiment.

Read or Write Operation

The following describes a row decoder function that reads or writes data to the TCAM array mat 2.

An operation overview is described below. When data is read from or written to the TCAM array mat 2, a signal (rw_add) indicating the write destination address is input to the BL sense amplifier and SL driver for register 9 as illustrated in FIG. 2. The BL sense amplifier and SL driver for register 9 activates the search line of the row address register 12 (addSL). The value for a row in the row address register 12 may match the signal (rw_add) indicating the write destination address. The match line corresponding to the matching row of the row address register 12 goes high. Otherwise, the match line goes low. This activates the word line corresponding to the write destination address.

Figure 8:
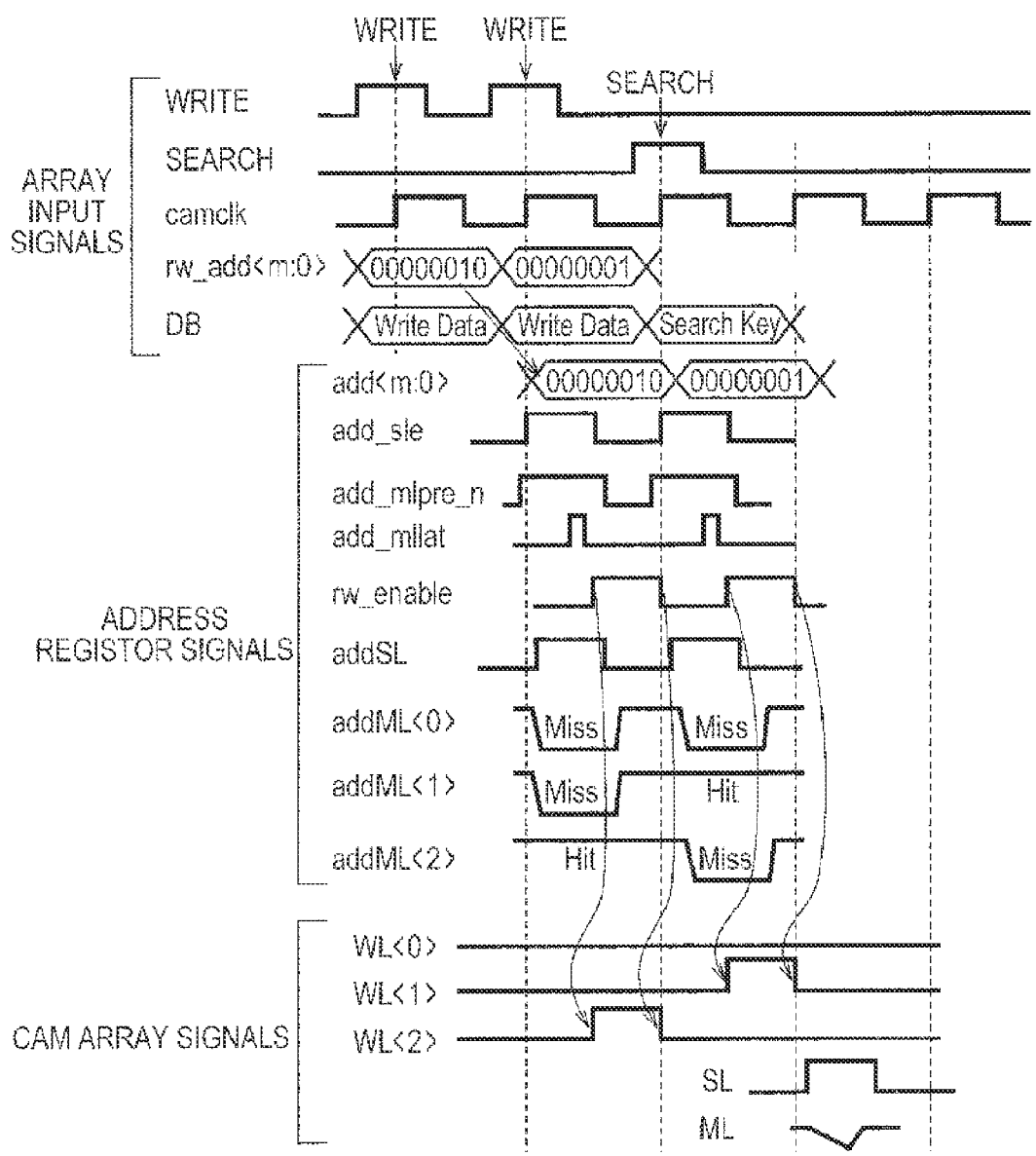
FIG. 8 illustrates signal waveforms during a write operation according to a first embodiment.

FIG. 8 illustrates signal waveforms during a write operation according to the first embodiment.

According to the example in FIG. 8, a write operation (WRITE) is performed at address 00000010 to activate WL<2> and at address 00000001 to activate WL<1>. A search operation (SEARCH) is subsequently performed on the TCAM array mat 2. The write operation and the search operation are performed successively.

The write destination address 00000010 is input to the BL sense amplifier and SL driver for register 9 (rw_add). The search is performed to find a row matching the value maintained for each row in the row address register 12 (add_sle, addSL). If a matching row is found, the match line for the row address register 12 goes high (add_mlpre_n, addML <2>). The latch circuit 24 of the WL driver for CAM cell 13 latches the match line (add_mllat). A write enable signal (rw_enable) activates the word line (WL<2>) for the write destination address.

The same applies to the next address 00000001. The word line (WL<1>) for the write destination address is activated.

The subsequent search operation activates the search line (SL) for the TCAM array mat 2. The match line (ML) not hit after the search is discharged and goes low. The word line is inactivated before the search starts. A search command for the search operation can be entered after a write command for the write operation. The NOP (no operation) command is unneeded.

Search Operation

The following describes the search operation in the TCAM array mat 2 according to the first embodiment.

Figure 9:
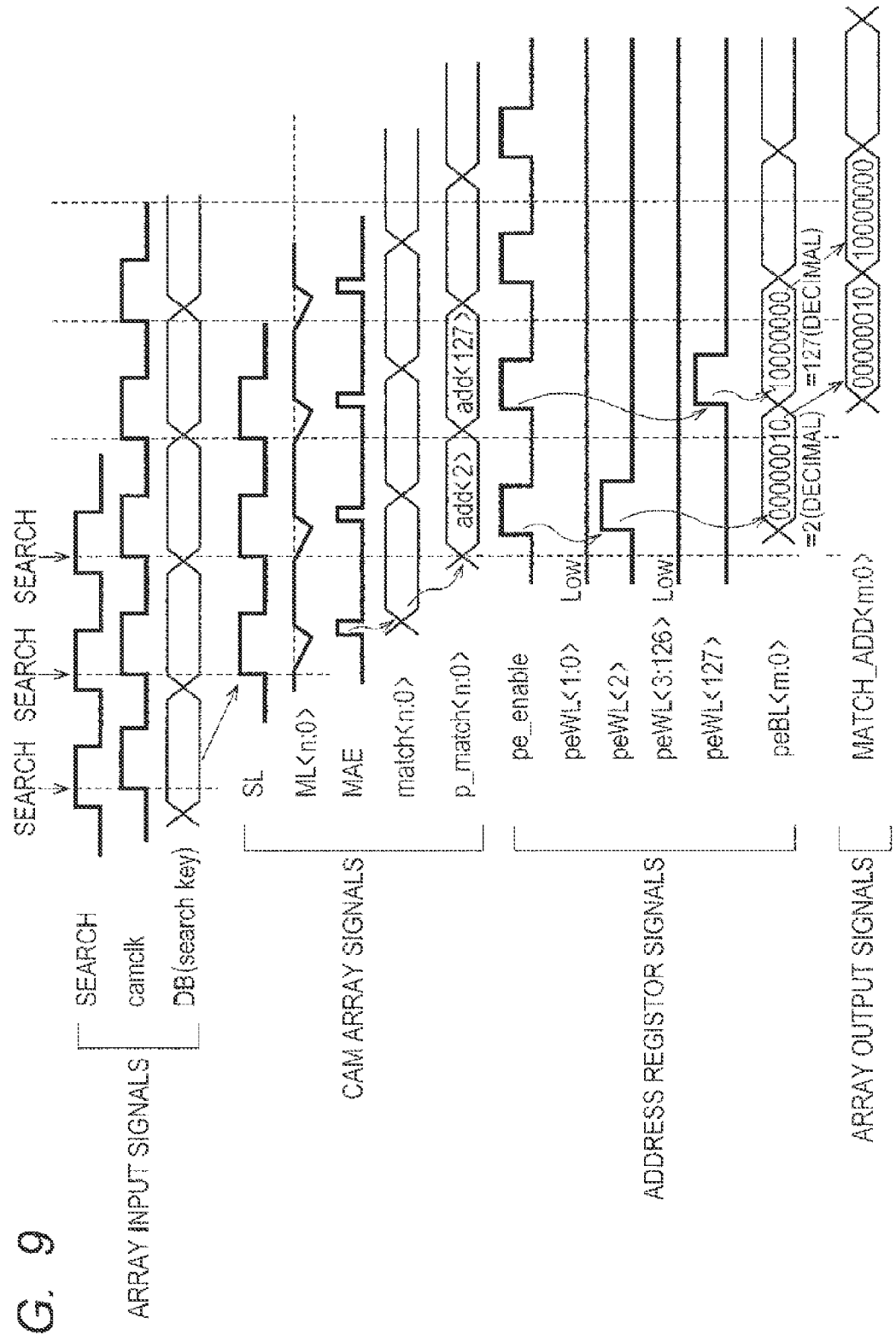
FIG. 9 illustrates signal waveforms during a search operation according to the first embodiment.

FIG. 9 illustrates signal waveforms during a search operation according to the first embodiment.

The control circuit 8 follows the command (SEARCH) to start the search operation on the TCAM array mat 2 at timings of a specified clock (camclk). The search line is activated. The match line for an entry corresponding to the search data goes high. The match amplifier 3 amplifies an output result from the match line. The match amplifier 3 operates according to a control signal (MAE). The output (match) amplified by the match amplifier 3 is input to the priority arithmetic portion 4. The priority arithmetic portion 4 allows the operation result output circuit 21 to prioritize any of the match lines and output a search result corresponding to the entry (p_match).

In the priority encoder and row decoder portion 5, the WL driver for row address register 11 activates the word line for the row address register 12 based on the search result at the timing according to the enable signal (pe_enable). FIG. 9 shows activation of word lines peWL<2> and peWL<127> corresponding to the second entry and the 127th entry. The bit line outputs the value of the row address register 12 corresponding to the activated word line to the BL sense amplifier and SL driver for register 9 (peBL). The BL sense amplifier and SL driver for register 9 outputs the address of the hit entry to the outside (MATCH_ADD).

Second Embodiment

Another embodiment will be described.

Figure 10:
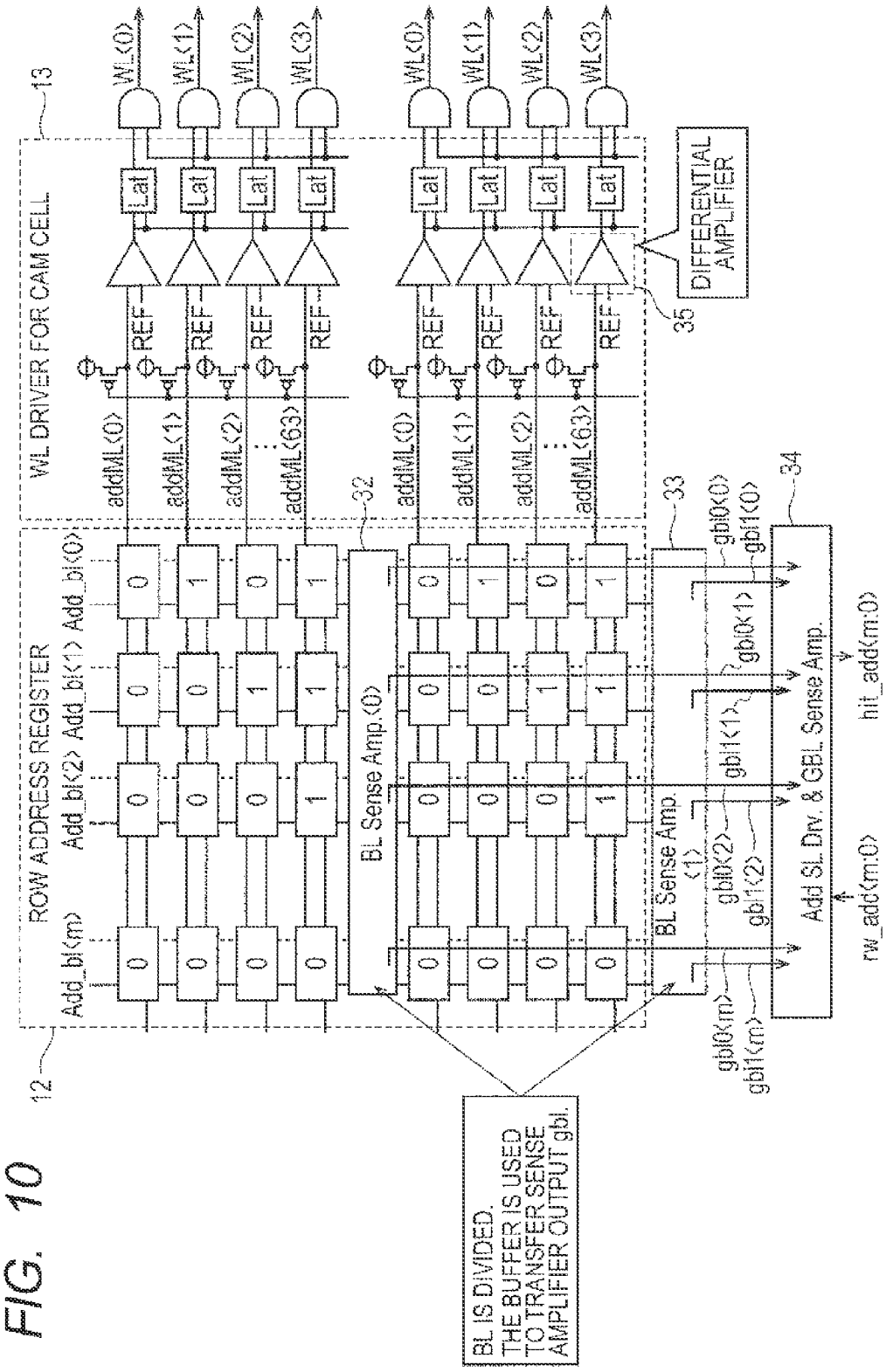
FIG. 10 illustrates a configuration of the row address register 12 according to a second embodiment.

FIG. 10 illustrates a configuration of the row address register 12 according to the second embodiment.

FIG. 10 illustrates divided bit lines for the row address register that outputs a search result to provide the function as the priority encoder.

For example, the sense amplifier can be allocated to a specified range of entries to accelerate the search result output. As illustrated in FIG. 10, there are provided two sense amplifiers, a first BL sense amplifier 32 and a second BL sense amplifier 33. The first BL sense amplifier 32 and the second BL sense amplifier 33 each correspond to some entries for the row address register 12. A GBL sense amplifier and SL driver for register 34 is equivalent to a sense amplifier that amplifies output from the bit line. The GBL sense amplifier and SL driver for register 34 accepts outputs (gbl0 and gbl1) from the BL sense amplifiers and outputs an address (hit_add) hit after the search.

As illustrated in FIG. 10, the WL driver for CAM cell 13 includes a differential amplifier 35. The differential amplifier accepts output from the match line for the row address register 12 to ensure faster operation.

Third Embodiment

Still another embodiment will be described. The third embodiment provides an FNH (force no-hit) register using CAM cells.

Figure 11:
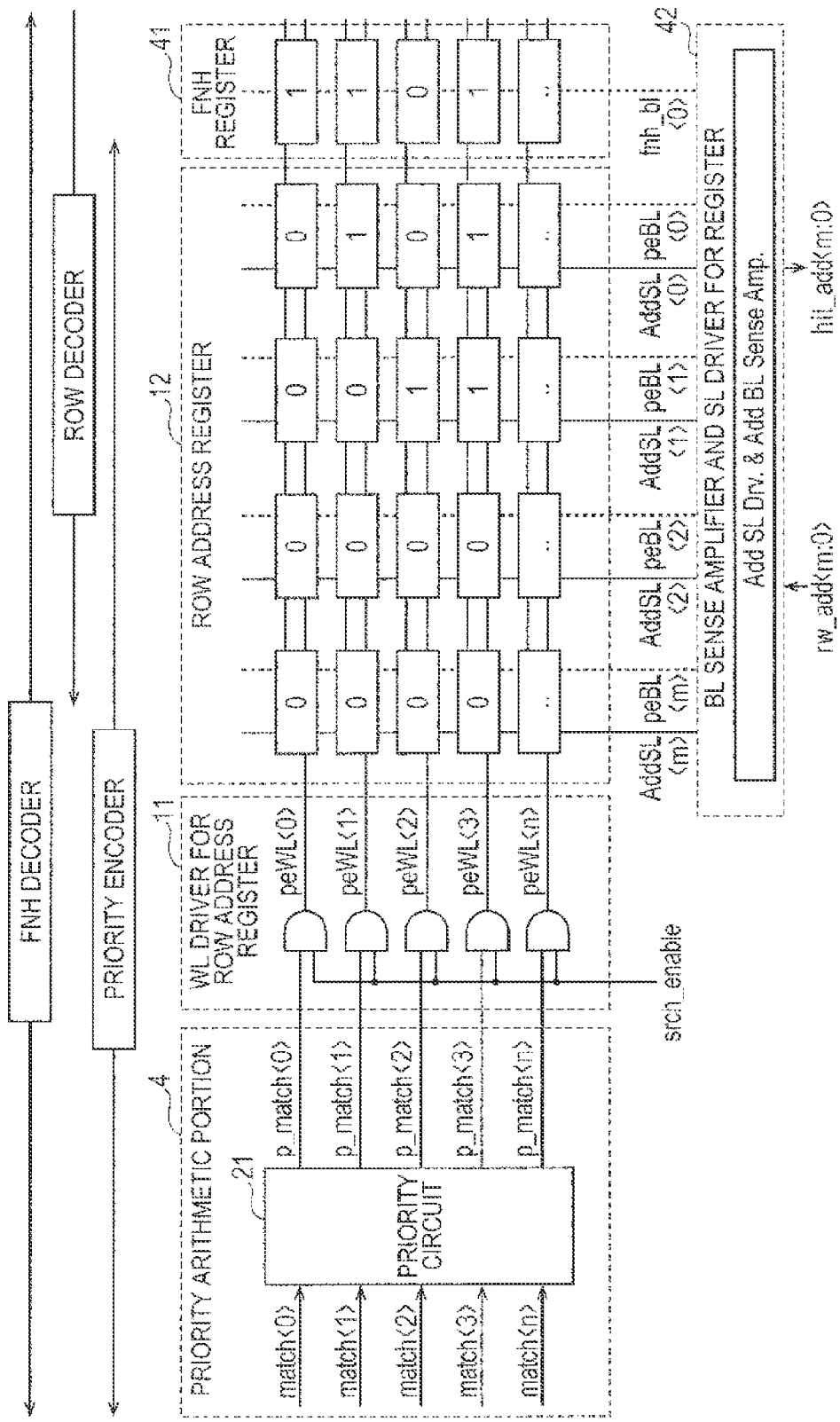
FIG. 11 illustrates a configuration of the row address register 12 and an FNH register 41 according to a third embodiment.

FIG. 11 illustrates a configuration of the row address register 12 and an FNH register 41 according to the third embodiment.

Figure 12:
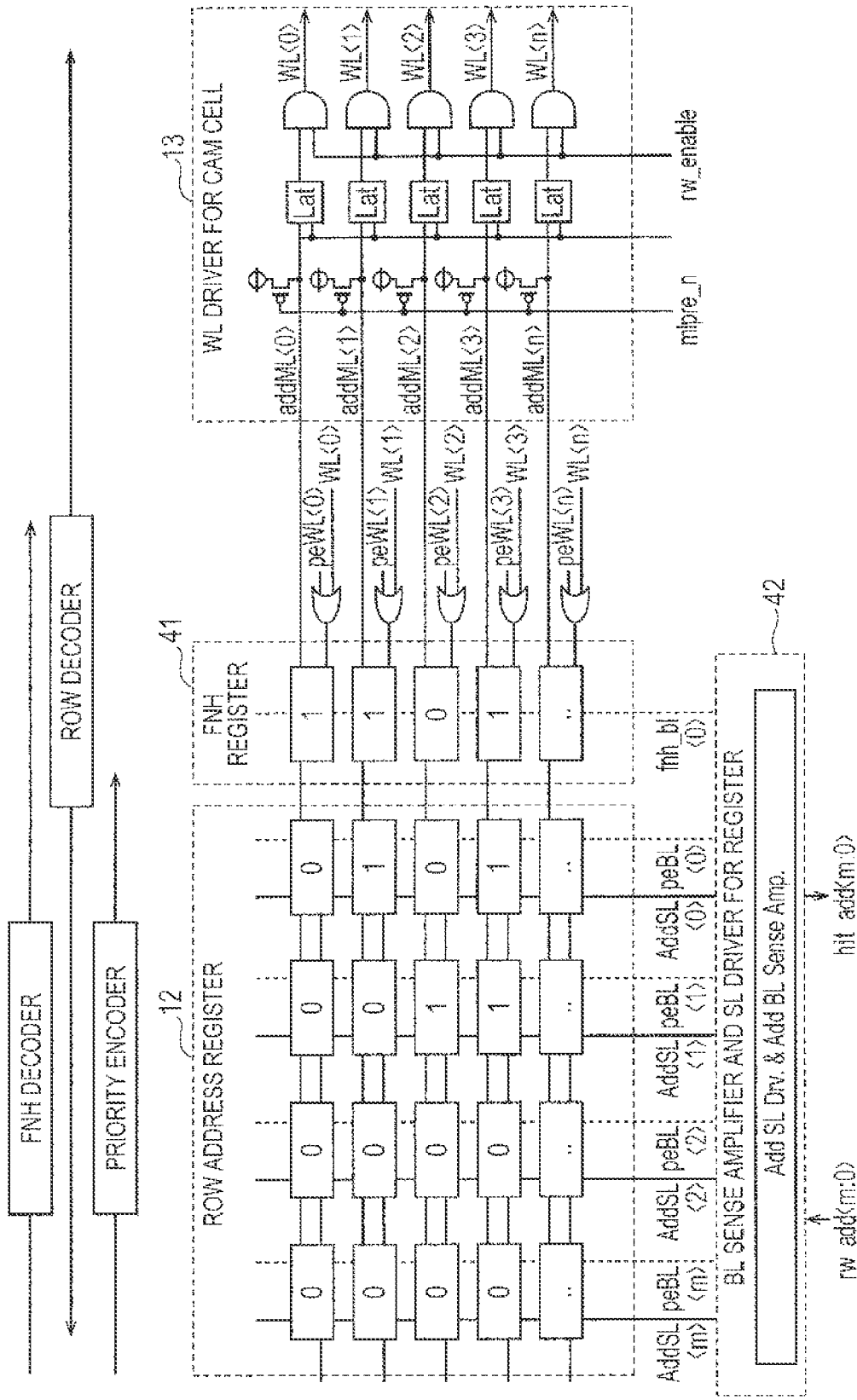
FIG. 12 illustrates a configuration of the row address register 12 and an FNH register 41 according to the third embodiment.

FIG. 12 illustrates a configuration of the row address register 12 and an FNH register 41 according to the third embodiment.

The row address register 12 and the FNH register using CAM cells are provided to enable faster operation under control of a BL sense amplifier and SL driver for register 42 (fnh_bl). For example, the search operation can reduce the latency before a bit address and FNH read data are output. An FNH decoder circuit can be eliminated to reduce the layout area and provide high integration.

Fourth Embodiment

Yet another embodiment will be described. The fourth embodiment provides a recovery information data register.

Figure 13:
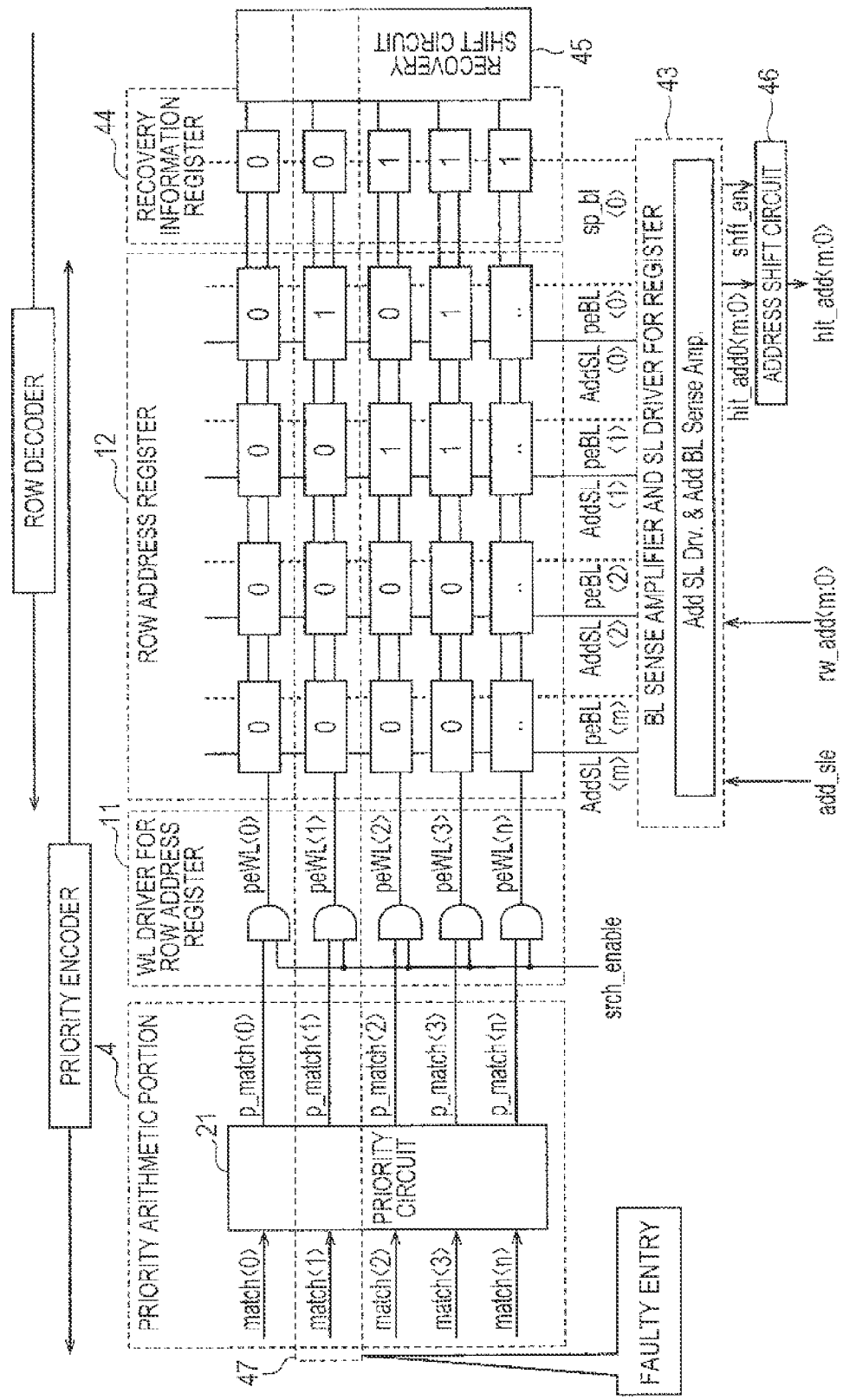
FIG. 13 illustrates part of a configuration according to a fourth embodiment.

FIG. 13 illustrates part of a configuration according to the fourth embodiment.

Figure 14:
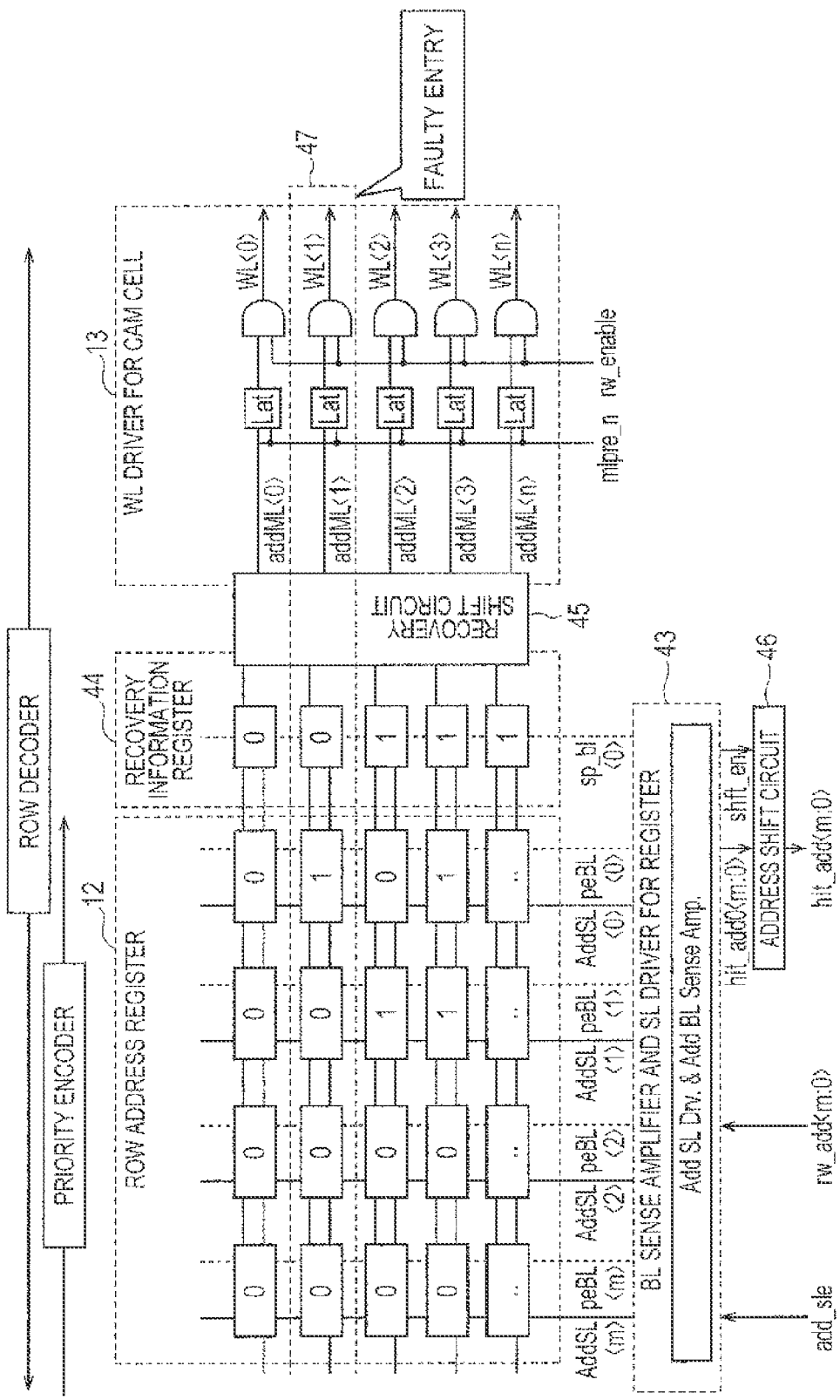
FIG. 14 illustrates part of a configuration according to a fourth embodiment.

FIG. 14 illustrates part of a configuration according to the fourth embodiment.

As illustrated in FIGS. 13 and 14, a faulty entry corresponds to WL<1>. A faulty-entry row 47 corresponds to WL<1>.

When recovering a faulty entry according to the fourth embodiment, a BL sense amplifier and SL driver for register 43 uses a control signal (sp_bl) to rewrite a recovery information register 44 without rewriting the row address register 12. To enable the function as the row decoder, a recovery information register 44 and a recovery shift circuit 45 recover a faulty entry. To enable the function as the priority encoder, an address shift circuit 46 shifts addresses for output because the row address register 12 is not rewritten.

For example, suppose that an entry corresponding to WL<1> is faulty. The address shift circuit 46 then decrements the address of an entry corresponding to WL<2> by one to change the address to 0001. Suppose that the WL driver for row address register 11 activates word line peWL<2> as a result of the search in the TCAM array mat 2. In this case, the value of the row address register 12 is not rewritten. The address shift circuit 46 shifts a match address (hit_add0) output from the BL sense amplifier and SL driver for register 43 and outputs the shifted address (hit_add).

The BL sense amplifier and SL driver for register 43 uses a control signal (hft_en) to notify the address shift circuit 46 of information (e.g., an address corresponding to the faulty entry) about a row that needs to be shifted to enable the function as the priority encoder. For example, the address shift circuit 46 compares the information notified by the BL sense amplifier and SL driver for register 43 about the address corresponding to the faulty entry with a match address (hit_add0) output from the BL sense amplifier and SL driver for register 43. The address shift circuit 46 shifts the match address (hit_add0) if it is found at or later than the address (shft_en) corresponding to the faulty entry.

Figure 15:
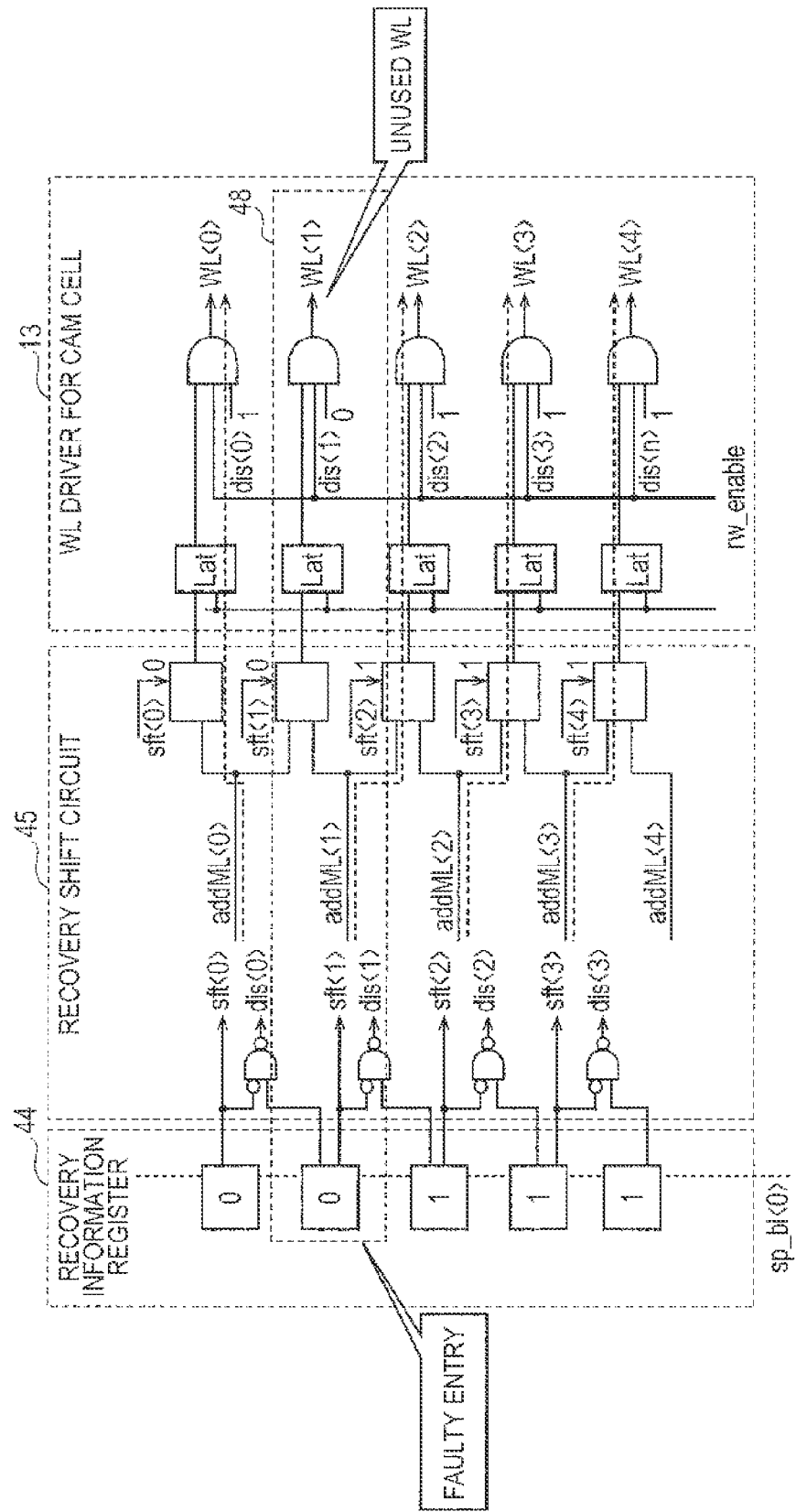
FIG. 15 illustrates in detail a recovery shift circuit 45 and a WL driver for CAM cell 13.

FIG. 15 illustrates in detail the recovery shift circuit 45 and the WL driver for CAM cell 13.

The recovery information register 44 includes a register corresponding to each row of the row address register 12. The register maintains value 1 for a row that needs to be shifted.

As illustrated in FIG. 15, the recovery shift circuit 45 accepts output from the register for each row of the recovery information register 44 and outputs signals (sft and dis). As illustrated in FIG. 15, output of the signal (dis) depends on the value of an adjacent row for the register in the recovery information register 44. The signal is output as 0 if the adjacent row maintains a different value. The signal (dis) disables the word line (WL<1> according to the example in FIG. 15) of the WL driver for CAM cell 13 corresponding to the faulty entry.

The recovery shift circuit 45 uses values of the registers corresponding to the rows of the recovery information register 44. For example, the recovery shift circuit 45 maintains value 1 in the register to which sft<2> is input. Match lines addML<1> and addML<2> are coupled to the register to which sft<2> is input. Output from one of the match lines is input to the latch circuit of the WL driver for CAM cell 13 depending on the value of sft<2>, namely, depending on whether the shift is needed.

The above-mentioned configuration can provide the faster operation as well as the recovery.

Fifth Embodiment

Still yet another embodiment will be described. According to the fifth embodiment, the TCAM in the row address register 12 uses SRAM (Static Random Access Memory), DRAM (Dynamic Random Access Memory), MRAM (Magnetoresistive Random Access Memory), or ROM (Read Only Memory).

FIG. 16 illustrates a TCAM basic cell to configure the TCAM using SRAM.

As described above, search data is input to a cell via the search line (SL). It is determined whether the search data matches stored data X (SNX) and Y (SNY). The result is always a miss if stored data X and Y are both 1s. The result is always a hit if stored data X and Y are both 0s.

Figure 17:
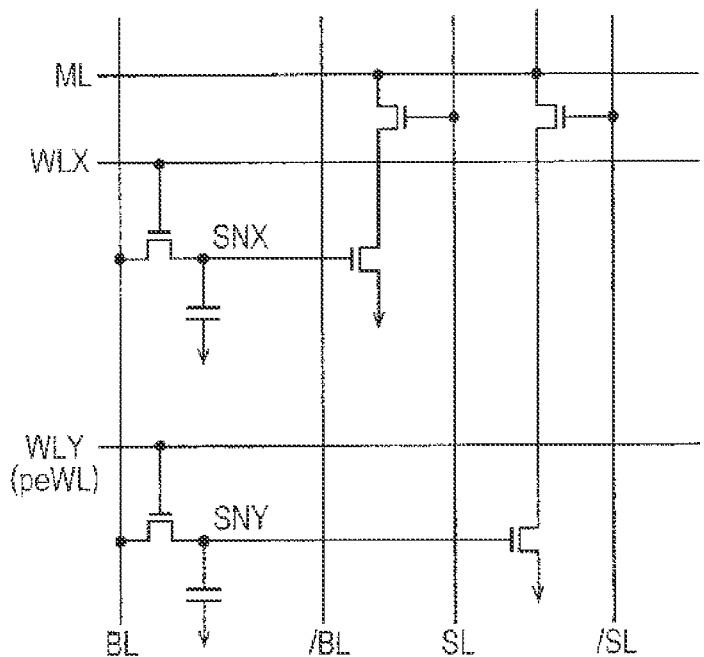
FIG. 17 illustrates a TCAM basic cell to configure TCAM using DRAM.

FIG. 17 illustrates a TCAM basic cell to configure the TCAM using DRAM. Similarly to the above, the search data (SL) is compared with the stored data (SNX and SNY). It is determined whether the search data matches the stored data.

Figure 18:
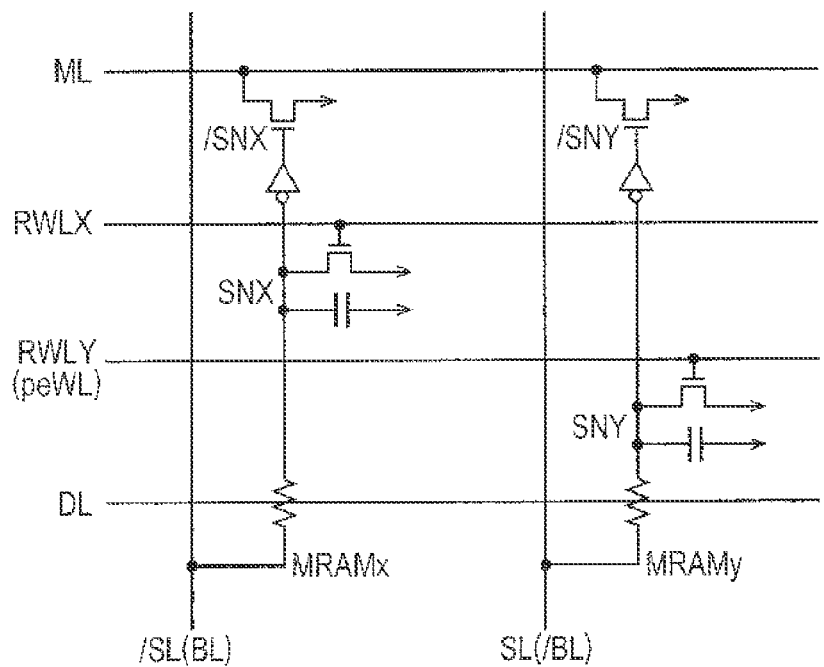
FIG. 18 illustrates a TCAM basic cell to configure TCAM using MRAM.

FIG. 18 illustrates a TCAM basic cell to configure the TCAM using MRAM. The cell includes bit lines (BL) used for reading and writing, word lines (RWLX and RWLY) for turning on a transistor during reading, and a digit line (DL) for applying a current during writing.

Figure 19:
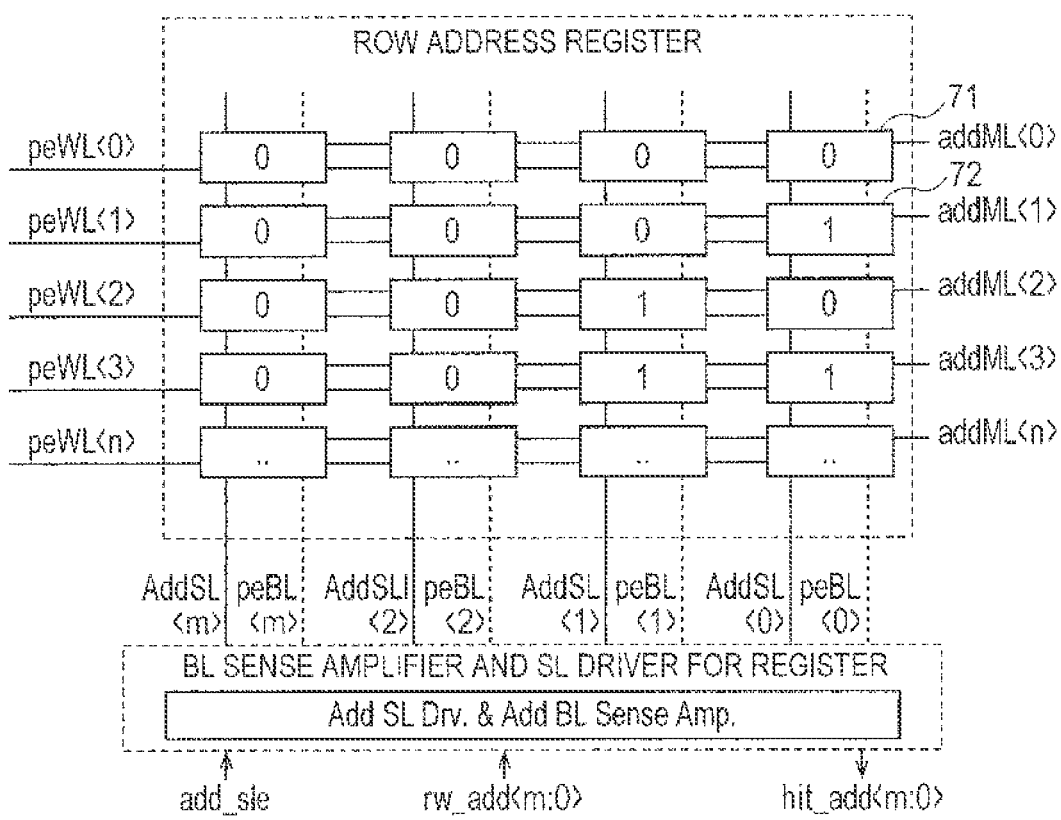
FIG. 19 illustrates a configuration of the row address register 12 using ROM.

FIG. 19 illustrates a configuration of the row address register 12 using ROM. Each CAM cell uses ROM.

As illustrated in FIG. 19, a cell 71 uses ROM configured to store 0. A cell 72 uses ROM configured to store 1.

Figure 20A:
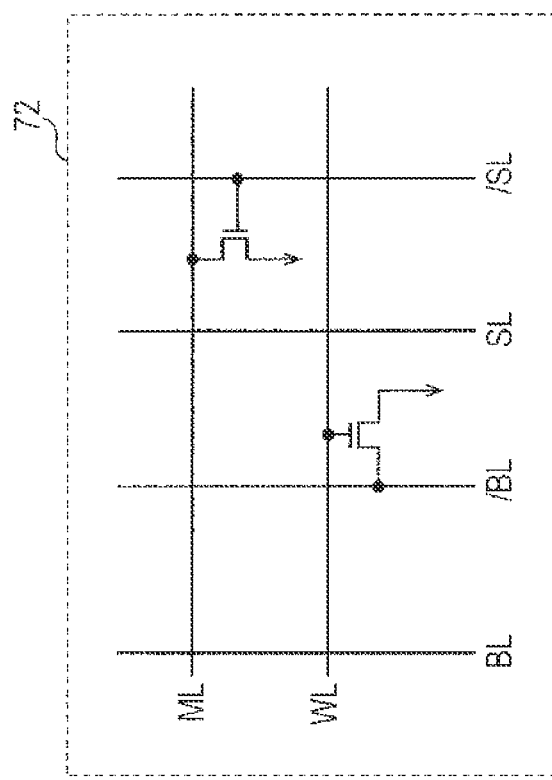
FIGS. 20A and 20B illustrate configurations of cells 71 and 72.
Figure 20B:
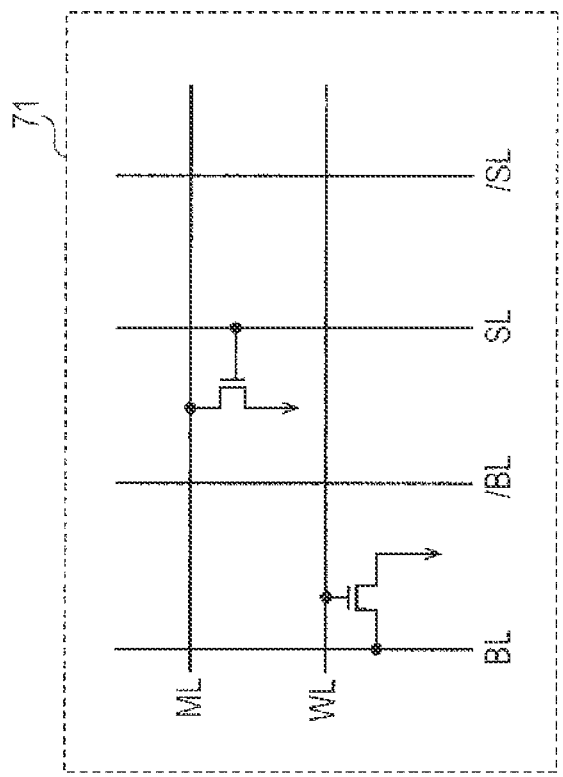

FIGS. 20A and 20B illustrate configurations of the cells 71 and 72.

FIG. 20A illustrates the cell 71. FIG. 20B illustrates the cell 72.

According to the embodiment, the row address register 12 is configured to use the memory that retains the stored contents even when not powered. The configuration eliminates the need for a sequence to provide the function as the recovery circuit enabled each time the power is turned on.

According to the above-mentioned example, the encoder and the decoder in the CAM share the address register. The above-mentioned configuration may be used for encoder and decoder circuits for technologies other than the CAM. The configuration can ensure faster operation and reduce the layout area if an address uses many bits or a circuit uses many logic stages for an encoder or a decoder.

While there have been described the embodiments, it is to be distinctly understood that the embodiments may be combined.

While there have been described specific preferred embodiments of the present invention created by the inventors, it is to be distinctly understood that the present invention is not limited thereto but may be otherwise variously embodied within the spirit and scope of the invention.

What is claimed is:

1. A content addressable memory (CAM) system comprising:
   an address register that includes a first row and a second row;
   a row decoder that specifies a first address of a first row in a data retention CAM array that is coupled to the first row of the address register, specifies a second address of a second row in the data retention CAM array that is coupled to the second row of the address register, and writes data to the first address and the second address; and
   a priority encoder that receives a first result of a comparison between data stored in the first row in the data retention CAM array and search data, receives a second result of a comparison between data stored in the second row in the data retention CAM array and the search data, and outputs, based on the first result and the second result, an address of a row in the data retention CAM array that matches a comparison result;
   wherein the row decoder and the priority encoder share addresses corresponding to data stored in the first row in the data retention CAM array and data stored in the second row in the data retention CAM array.

2. The content addressable memory system according to claim 1, wherein the row decoder includes the address register and the priority encoder includes the address register.

3. A content addressable memory (CAM) system comprising:
   a row address register;
   a first word line driver that receives an input from the row address register via at least one of a plurality of match lines that connect the row address register to the first word line driver, and outputs stored content to at least one of a plurality of word lines of a data retention CAM array;
   a second word line driver that provides an input to the row address register via at least one of a plurality of word lines that connect the row address register to the second word line driver;
   a row decoder that includes the first word line detector and the row address register; and
   a priority encoder that includes the second word line detector and the row address register,
   wherein the row decoder and the priority encoder share addresses corresponding to data stored in a first row in the data retention CAM array and data stored in a second row in the data retention CAM array.

* * * * *